United States Patent
Zaidat et al.

(10) Patent No.: US 12,247,785 B2
(45) Date of Patent: *Mar. 11, 2025

(54) COLD CRUCIBLE

(71) Applicants: INSTITUT POLYTECHNIQUE DE GRENOBLE, Grenoble (FR); CENTRE NATIONAL DE LA RECHERCHE SCIENTIFIQUE, Paris (FR); UNIVERSITE GRENOBLE ALPES, Saint Martin d'Heres (FR)

(72) Inventors: Kader Zaidat, Saint Martin d'Heres (FR); Christian Garnier, Eybens (FR); Ghatfan Hasan, Saint Martin d'Heres (FR)

(73) Assignees: INSTITUT POLYTECHNIQUE DE GRENOBLE, Grenoble (FR); CENTRE NATIONAL DE LA RECHERCHE SCIENTIFIQUE, Paris (FR); UNIVERSITE GRENOBLE ALPES, Saint Martin d'Heres (FR)

( * ) Notice: Subject to any disclaimer, the term of this patent is extended or adjusted under 35 U.S.C. 154(b) by 594 days.

This patent is subject to a terminal disclaimer.

(21) Appl. No.: 17/429,214

(22) PCT Filed: Feb. 6, 2020

(86) PCT No.: PCT/EP2020/053051
§ 371 (c)(1),
(2) Date: Aug. 6, 2021

(87) PCT Pub. No.: WO2020/161269
PCT Pub. Date: Aug. 13, 2020

(65) Prior Publication Data
US 2022/0128303 A1  Apr. 28, 2022

(30) Foreign Application Priority Data

Feb. 7, 2019 (FR) ...................... 1901244

(51) Int. Cl.
*F27B 14/10* (2006.01)
*C30B 35/00* (2006.01)

(52) U.S. Cl.
CPC ............ *F27B 14/10* (2013.01); *C30B 35/002* (2013.01); *F27B 2014/108* (2013.01)

(58) Field of Classification Search
CPC ..... C30B 15/10; C30B 15/305; C30B 35/002; F27B 14/10; F27B 2014/108; H05B 6/24
(Continued)

(56) References Cited

U.S. PATENT DOCUMENTS 4,432,093 A * 2/1984 Reboux ................. F27B 14/063
219/630
5,109,389 A 4/1992 Stenzel
(Continued)

FOREIGN PATENT DOCUMENTS

CN 102260769 * 11/2011 .............. F27B 14/10
DE 10042151 A1 3/2002
(Continued)

OTHER PUBLICATIONS

CN102260769 English machine translation Version (Year: 2011).*
(Continued)

*Primary Examiner* — Jessee R Roe
*Assistant Examiner* — Michael Aboagye
(74) *Attorney, Agent, or Firm* — HAUPTMAN HAM, LLP

(57) ABSTRACT

A cold crucible having application in the field of making monocrystalline materials at high temperature. The cold crucible includes: a cold cage having sectors made of a good electrical conductor material and in which a charge is molten, and a cooling device with a heat-transfer fluid, configured so as to cool down, from inside, each segment of the cold cage. At least one sector of the cold crucible includes a housing and is removable, the housing being proper and intended to accommodate at least one so-called functionalising device of the cold crucible. Henceforth, it is possible to functionalise each sector independently of the others, by accommodating therein, a functionalising device configured, inter alia, so as to modify and/or analyse at least one property of the charge, in particular the molten charge, in the cold cage.

16 Claims, 7 Drawing Sheets

(58) Field of Classification Search
USPC .......................................................... 266/275
See application file for complete search history.

(56) References Cited

U.S. PATENT DOCUMENTS

| | | | |
|---|---|---|---|
| 7,000,678 B1 * | 2/2006 | Mon ....................... | C30B 29/06 |
| | | | 373/138 |
| 8,673,048 B2 * | 3/2014 | Song ....................... | C22B 21/06 |
| | | | 204/557 |
| 10,965,174 B2 * | 3/2021 | Yamada ................... | H02K 1/14 |
| 11,125,504 B2 * | 9/2021 | Moon ...................... | F27B 14/06 |
| 2007/0147463 A1 | 6/2007 | Roberts et al. | |

FOREIGN PATENT DOCUMENTS

| | | |
|---|---|---|
| JP | 1152095 A | 2/1999 |
| WO | 2017093165 A1 | 6/2017 |

OTHER PUBLICATIONS

International Search Report and Written Opinion issued in corresponding International Application No. PCT/EP2020/053051, dated Feb. 26, 2020, pp. 1-10, European Patent Office, Rijswijk, Netherlands.

* cited by examiner

-- Prior Art --

-- Prior Art --

COLD CRUCIBLE

The present application is a U.S. National Phase of International Application Number PCT/EP2020/053051, filed Feb. 6, 2020, which claims priority to French Application No. 1901244, filed Feb. 7, 2019.

TECHNICAL FIELD

The invention relates to the field of cold crucibles. It finds a particularly advantageous application in the field of material making at high-temperature.

In a known manner, a cold crucible comprises:
- a so-called cold cage comprising sectors made of a good electrical conductor material, copper in general, and in which a charge to be molten is intended to be introduced, and
- a cooling device with a heat-transfer fluid, water in general, the cooling device being configured so as to cool down, from inside, each segment of the cold cage.

To operate, each cold crucible uses an electromagnetic induction external coil surrounding the cold cage and in which an alternating current flows.

Each cold crucible may further be used with a device for continuously feeding the constituent material of the charge.

STATE OF THE ART

There are several types of cold crucibles two of which are illustrated in the appended FIGS. 1 and 2. There are other types of cold crucibles that are not illustrated herein which comprise for example the so-called double-crucible models. Irrespective of the considered crucible type, its operating principle is substantially common to the other ones; it is as introduced hereinbelow with reference to FIGS. 1 and 2.

The cold crucible 1 and the coil 2 are placed in a heat-insulated enclosure 5 with a monitored atmosphere, preferably devoid of oxygen, often filled with an inert gas such as Argon, at a determined pressure. Nonetheless, making of materials in a cold crucible may also be used under an oxygen-rich atmosphere.

When an alternating current is injected in the coil 2 surrounding the cold cage 10, induced currents appear in each of the cooled sectors 100 of the cage, these currents produce, in turn, an eddy current across the so-called electromagnetic skin thickness of a charge 20 located in the cage. These eddy currents allow heating up the charge 20, where appropriate until melting thereof, yet without the cold crucible 1 being heated.

Of course, heating of the charge being achieved by electromagnetic induction, the charge 20 must be electrically conductive. The electromagnetic skin thickness 21 of the charge 20 depends on the resistivity of this charge and on the frequency used for the alternating current injected into the coil 2. It should be noted that this electromagnetic skin 21 is the portion of the charge 20 located the closest to the cold cage 10.

The cold crucible 1 may further be used to melt down semiconductor materials. To this end, the cold crucible 1 is implemented, in a known manner, with a device for preheating the charge 20 to make it conductive. In general, this preheating device (not represented) comprises a cap made of graphite arranged on top of the cold crucible 1 and, where appropriate, provided with a gas stream ventilation system configured so as to avoid any pollution of the charge 20 by the graphite of the cap.

The known advantages of this technology are: the levitation of the molten charge 20 which explains in particular the relative oddness of cold crucibles 1, the potential absence of external pollution (in particular by oxygen or graphite) in the materials 22 that are made and a stirring of the molten charge 20 enabling making of materials 22, and in particular of an alloy, with a very good homogeneity.

Cold crucibles are currently used for making of metallic alloys, for example based on Titanium, Niobium, etc. Indeed, the use of cold crucibles in metallurgy has actually become a quite popular tool for its stirring quality that allows obtaining alloys with a very homogeneous composition. This homogeneity is ensured by a vigorous stirring due to the presence of a very large electromagnetic force, which can be observed in particular across the thickness of the electromagnetic skin of the molten charge.

It is sufficient to cut off the alternating current flowing in the coil 2 so as to stop the levitation of the molten charge 20, while removing a plug 3 plugging the bottom of the cold crucible 1, as illustrated in FIG. 1, so that the molten charge flows out into a mould located beneath the cold crucible.

Referring to FIG. 1, the use of cold crucibles 1 has also been considered to make monocrystals, in particular semiconductor materials. This technique uses a perfectly monocrystalline seed to initiate the growth of monocrystalline ingots 22. The seed 23 is introduced into the molten charge 20 of the material to be crystallised, then the set composed by the seed 23 and the monocrystal 22 growing on the seed 23 is displaced upwards (Cf. FIG. 1) or downwards (Cf. FIG. 2, and in particular the elements bearing the reference numerals 3 (cooled finger) and 4 (vertical translation tray)) to make the monocrystal 22 grow lengthwise, and ideally in diameter.

A drawback of the existing cold crucibles is that they do not allow, or do not easily allow, performing functions other than that that is conventionally assigned thereto. More particularly, a current cold crucible often has only one function consisting in enabling the melting of the charge that it contains.

Hence, an object of the present invention is to provide a cold crucible allowing overcoming all or part of the aforementioned drawbacks. More particularly, an object of the present invention is to provide a cold crucible allowing filling other functions than that which is conventionally assigned thereto and which consists in enabling the melting of the charge that it contains.

The other objects, features and advantages of the present invention will appear upon reviewing the following description and the appended drawings. It should be understood that other advantages could be incorporated.

SUMMARY

To achieve this objective, according to one embodiment, the present invention provides a cold crucible, in accordance with the generic definition given in the preamble hereinabove, essentially such that at least one sector of the cold crucible comprises a housing, called (multi)functionalising housing, and is removable. The (multi)functionalising housing is proper (or suitable) and intended to accommodate therein at least one (multi)functionalising device of the sector that comprises it, and more generally of the cold crucible itself. The (multi)functionalising device may be comprised by the sector that accommodates it, and more generally by the cold crucible itself. More particularly, said at least one sector of the cold crucible is removable from at least one amongst the cooling device and at least one other sector of the cold crucible.

Where appropriate, the cold crucible further comprises a device for fastening and holding at least one sector, preferably each sector, to at least one amongst the cooling device and at least one other sector. The fastening and holding device is configured so that, once fastened and held, said at least one sector forms a portion of the cold cage.

Henceforth, it is possible to (multi)functionalise said at least one sector independently of the others, by accommodating, in the housing that it comprises, at least one (multi)functionalising device. A (multi)functionalising device may be defined, without it being necessarily limited to this definition, as a device configured so as to modify and/or analyse at least one property of the charge, in particular the molten charge, in the cold cage. The (multi)functionalising device may comprise, and possible consist of, a device for modifying and/or analysing at least one property of the charge. Without limitation, the (multi)functionalising device may be one amongst:
  a device for generating an electromagnetic field, preferably a permanent magnet,
  a ferrite,
  a complementary heating device (microwave, infrared, ultraviolet . . . ),
  an ultrasonic transducer, and
  a piezoelectric device.

It is also understood that the cold crucible multifunctionalised in this manner has a great modularity. Indeed, numerous combinations between sectors and (multi)functionalising devices could be considered, each potentially allowing for one or several particular modification(s) or analysis(es) of the charge.

Not only does the cold crucible according to the invention allow making the sectors active in the monitoring or characterisation of the charge, in particular the molten charge, but it also allows reducing the manufacturing cost and the maintenance cost.

The cooling device comprising a channel for the circulation of the heat-transfer fluid configured so as to enable cooling of the cold cage and extending partially in at least one sector, preferably in each sector, the (multi)functionalising housing may be in communication, and possibly form only one housing, with the portion of the circulation channel extending in the sector. An advantage of this configuration is that the cooling device may then serve in cooling down not only the sector, like before, but also the (multi)functionalising device.

Alternatively, the (multi)functionalising housing may be distinct from the portion of the circulation channel extending in the sector. This alternative configuration is to be preferred when a contact between the heat-transfer fluid and the (multi)functionalising device is to be avoided. More particularly, such a contact could make the (multi)functionalising device dysfunctional, or less reliable, accurate, active, etc.

Preferably, the (multi)functionalising device is based on a material that is less good electrical conductor than the material, copper in general, on which the sectors are based. In this manner, each (multi)functionalising device accommodated inside a sector is not subjected to the effect of the magnetic field.

Alternatively or complementarily, the (multi)functionalising device may be arranged together with a support, more particularly an adapter, based on a material that is less good electrical conductor than the material, copper in general, on which the sectors are based. For example, the support is configured so as to electrically isolate the (multi)functionalising device and the sector that accommodates it from one another. Thus, said support enables the sector to fill its electromagnetic shielding role, even when the (multi)functionalising device is based on a material that is as good electrical conductor, and possibly better electrical conductor, as the material on which the sectors are based.

Preferably, said support is configured so as to adapt (or adjust) said (multi)functionalising device to the (multi)functionalising housing intended to accommodate it. Henceforth, the (multi)functionalising housings may have standardised size and shape. The manufacture of the cold crucible according to the invention is therefore facilitated and its cost reduced.

In the case where the (multi)functionalising device comprises, or consists of, a ferrite, it may be configured so as to concentrate the electromagnetic field lines located at the periphery of the sector that accommodates it. Several sectors may accommodate such a (multi)functionalising device, it is henceforth possible to concentrate the electromagnetic field lines in some locations of the cold crucible, in an independent and modular manner, because each of the sectors is independent.

In the case where the (multi)functionalising device comprises, or consists of, an ultrasonic transducer, it may be configured so as to characterise the molten charge by measuring the displacement speeds of the matter therewithin.

In the case where the (multi)functionalising device comprises, or consists of, a piezoelectric device, it may be configured so as to introduce pressure waves within the charge, in particular the molten charge.

In the case where the (multi)functionalising device comprises, or consists of, a complementary heating device (microwaves, infrared, ultraviolet) selected according to the characteristics of the material to be made, it may be configured so as to produce, through the wall of the cold finger, a heating parameterised so as to increase the thermal characteristics of the charge.

In the case where the (multi)functionalising device comprises, or consists of, a device for generating an electromagnetic field, it may be configured so as to generate an electromagnetic field, preferably a static (or quasi-static) magnetic field, in the charge, in particular the molten charge, and in particular across an electromagnetic skin thickness of the molten charge.

More particularly, each generation device may be configured so as to generate an electromagnetic field, and preferably a static magnetic field, with enough density to be felt by the molten charge in the cold cage, and more particularly at least, and possibly only, across an electromagnetic skin thickness of the molten charge in the cold cage. Henceforth, each electromagnetic field can act to slow down the electromagnetic stirring of the molten charge.

Henceforth, the cold crucible according to this last feature allows making successively monocrystalline ingots with a significantly larger diameter in comparison with the diameter of the seed allowing initiating the growth thereof. Such monocrystalline ingots may be made of various conductor or semi-conductor materials. Wafers cut in monocrystalline ingots of semiconductor materials made in this manner may advantageously be applied in numerous fields, and in particular in the power electronics field.

More specifically, each device for generating a magnetic field may be configured so as to generate an electromagnetic field, and preferably a static magnetic field, having a density substantially higher than 0.02 T, preferably substantially higher than 0.05 T, at a distance substantially larger than 2 mm from one of its edges directed inwardly of the cold cage.

For example, each device for generating a magnetic field is configured so as to generate an electromagnetic field, and preferably a static magnetic field, having a density substantially comprised between 0.07 and 0.8 T (more preferably substantially comprised between 0.1 and 0.3 T), at a distance substantially comprised between 0.1 and 12 mm of the generation device (more preferably substantially comprised between 4 and 10 mm) from one of its edges directed inwardly of the cold cage.

More particularly, each generation device is accommodated within its sector so as to be located, by one of its edges directed inwardly of the cold cage, at a distance substantially smaller than 12 mm, preferably substantially smaller than 9 mm, and still more preferably substantially smaller than 6 mm, from the molten charge in the cold crucible.

Each sector being based on a merely resistive material, copper in general, serves as an (electromagnetic) shield to protect the generation device that it accommodates. Indeed, the induced currents in the sectors thus naturally flow across the thickness of the walls, for example made of copper, of the sectors.

Furthermore, each generation device is configured in the sector that accommodates it so as to be cooled down by the cooling device of the cold crucible. The same cooling device can allow guaranteeing holding of a monitored temperature of the generation devices and of the sectors.

According to a preferred embodiment of the invention, at least one generation device comprises at least one permanent magnet. The joint arrangement of each permanent magnet with the cooling device is then more particularly configured so as to guarantee keeping the permanent magnet at a temperature always lower than the Curie temperature beyond which the magnet loses its magnetisation. Preferably, each permanent magnet is more particularly such that it generates a static magnetic field with a density substantially equal to 0.8 T at a distance of 2 mm from its edges. Preferably, each permanent magnet consists of a material having an electrical resistivity higher than that of the constituent material of the sectors of the cold cage. For example, each permanent magnet is made of an iron and/or neodymium based material.

According to a preferred embodiment of the invention, at least one device for generating a static magnetic field comprises a plurality of permanent magnets. Preferably, the permanent magnets of each plurality are arranged with respect to one another so as to generate, at least in the direction of the inside of the cold cage, a more powerful static magnetic field, in terms of magnetic field value, than the static magnetic field generated by each permanent magnet considered separately. For example, the permanent magnets of each plurality are arranged with respect to one another according to a so-called Halbach configuration.

Optionally, the invention may further have at least any one of the following features:

According to an embodiment of the invention, the fastening and holding device comprises a base, made of stainless steel in general, configured so as to removably fasten therein each sector of the cold crucible so that the sectors and the base form together the cold cage. Preferably, fastening of each sector on the base is configured so as to enable the circulation of the heat-transfer fluid of the cooling device through the base in the sector. A sealing gasket, for example in the form of a cylinder head gasket or of an O-ring gasket, may, where appropriate, be arranged between the base and the sectors, or directly between the sectors and the cooling device, in particular in the absence of a base;

Preferably, at least one (multi)functionalising device comprises a first portion configured so as to functionalise the cold crucible and a second portion, called support portion, configured so as to support the first portion of the (multi)functionalising device and to tightly cooperate with the housing of the (multi)functionalising device in the sector. Preferably, the support portion of the (multi)functionalising device is configured so as to support a plurality of permanent magnets, for example arranged with respect to one another according to a so-called Halbach configuration. Alternatively, or complementarily, the support is configured so as to form, together with the internal walls of its housing in the sector, and where appropriate with the first portion of the (multi)functionalising device that it supports, a circulation pathway for the heat-transfer fluid of the cooling device;

According to a particular embodiment, only two sectors opposite to one another accommodate a (multi)functionalising device as introduced hereinabove;

According to another particular embodiment, only three sectors arranged substantially according to a 3-order rotational symmetry accommodate a (multi)functionalising device as introduced hereinabove;

According to another particular embodiment, only four sectors arranged substantially according to a 4-order rotational symmetry accommodate a (multi)functionalising device as introduced hereinabove;

According to another particular embodiment, one sector out of two adjacent sectors accommodates a (multi)functionalising device as introduced hereinabove;

According to another particular embodiment, each sector accommodates a (multi)functionalising device as introduced hereinabove.

BRIEF DESCRIPTION OF THE FIGURES

The aims, objects, as well as features and advantages of the invention will appear better from the detailed description of one embodiment of the latter which is illustrated by the following appended drawings wherein.

Figure 1:
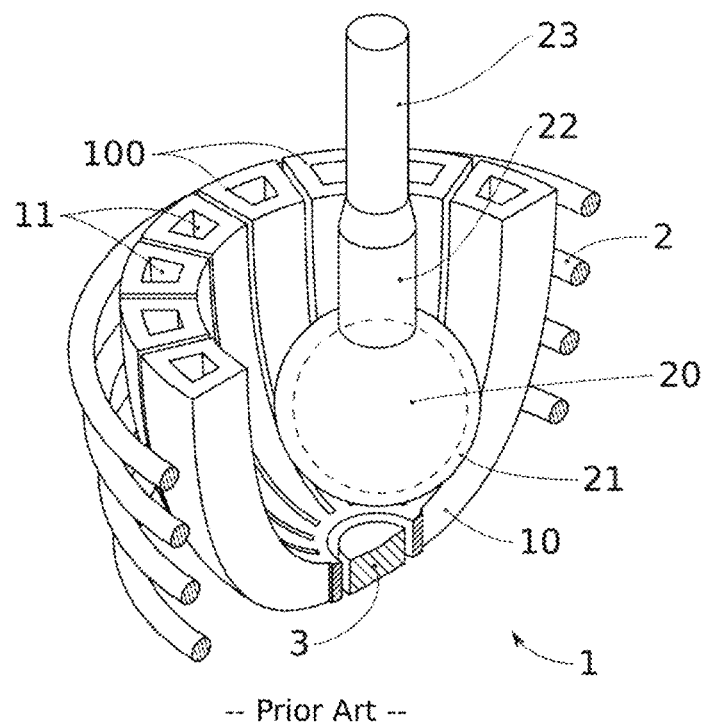
FIG. 1 schematically represents a perspective view of a cold crucible according to the prior art open in two, arranged together with an electromagnetic induction coil and comprising a charge from which a seed is progressively removed to make a monocrystal grow.
Figure 2:
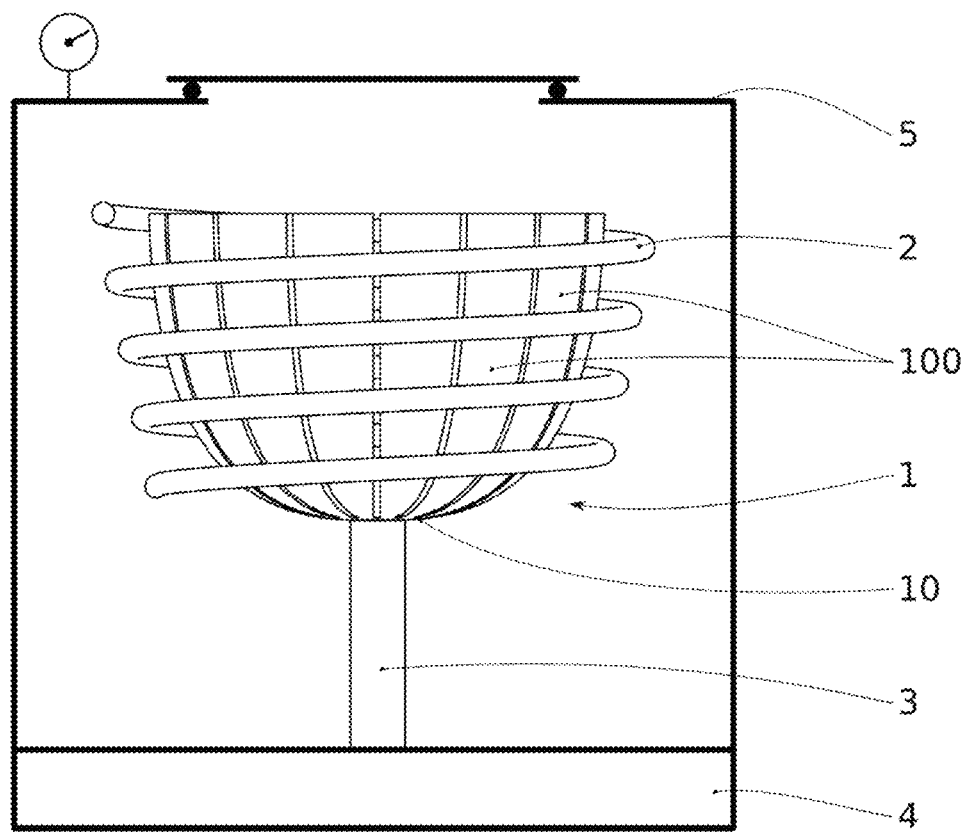
FIG. 2 schematically represents a front view in transparency of a heat-insulated enclosure containing a cold crucible according to a prior art other than that illustrated in FIG. 1.

The drawings are provided as examples and do not limit the invention. They consist of schematic principle representations intended to facilitate understanding of the invention and are not necessarily to the scale of the practical applications.

DETAILED DESCRIPTION

By "lower than" and "higher than", it should be understood "lower than or equal to" and "higher than or equal to" respectively. Equality is excluded by the use of the terms "strictly lower than" and "strictly higher than". Also, the expressions of the type "equal to, lower than, higher than" should be understood as comparisons that could allow for some tolerances, in particular depending on the magnitude scale of the compared values and the measurement uncertainties. Substantially equal, lower or higher values fall within the scope of interpretation of the invention.

By a parameter "substantially equal to/higher than/lower than" a given value, it should be understood that this parameter is equal to/higher than/lower than the given value, within 20%, and possibly 10%, of this value. By a parameter "substantially comprised between" two given values, it should be understood that is parameter is at minimum equal to the smallest given value, within 20%, and possibly 10%, of this value, and at maximum equal to the largest given value, within 20%, and possibly 10%, of this value.

It is specified that, in the context of the present invention, the term "over", "surmounts", "covers" or "underlying" or equivalents thereof do not necessarily mean "in contact with".

By "arranged together with", it should be understood that the functional relationship of two structural elements with one another according to which one amongst the two elements is arranged according to the other element. In particular, one of the elements may be arranged according to the dimensions and shapes of the other element and/or according to a particular disposition defined with respect to a setup of the other element, so as to fill a particular function together. Hence, these terms aim to cover a variety of relative arrangements of two structural elements with respect to one another, which variety has not to be detailed exhaustively.

By an element based on a material A, it should be understood an element comprising this material A and possibly other materials.

By "electromagnetic field", it should be understood a field represented by the set $(\vec{E},\vec{B})$, where $\vec{E}$ is the electric field and $\vec{B}$ is the magnetic field, such that a particular with a charge q and a velocity vector $\vec{v}$ is subjected to a force which is expressed as follows:

$$\vec{F}=q(\vec{E}+[\vec{v}\wedge\vec{B}])$$

The definition of the electromagnetic field herein comprises that of a magnetic field, and a fortiori that of a static magnetic field, which represent particular cases of electromagnetic field.

By a Halbach configuration, it should be understood a special arrangement of permanent magnets which increase the magnetic field on one side of the arrangement while almost cancelling the field at the other side.

By good electrical conductor material, it should be understood a material whose electrical resistivity is substantially lower than $6 \cdot 10^{-8}$ ohm·m, preferably substantially lower than $2 \cdot 10^{-8}$ ohm·m.

As mentioned in the introduction, an object of the present invention is to provide a cold crucible allowing performing other functions than that for which they are conventionally intended and which consists in enabling melting of the charge that it contains.

Figure 3:
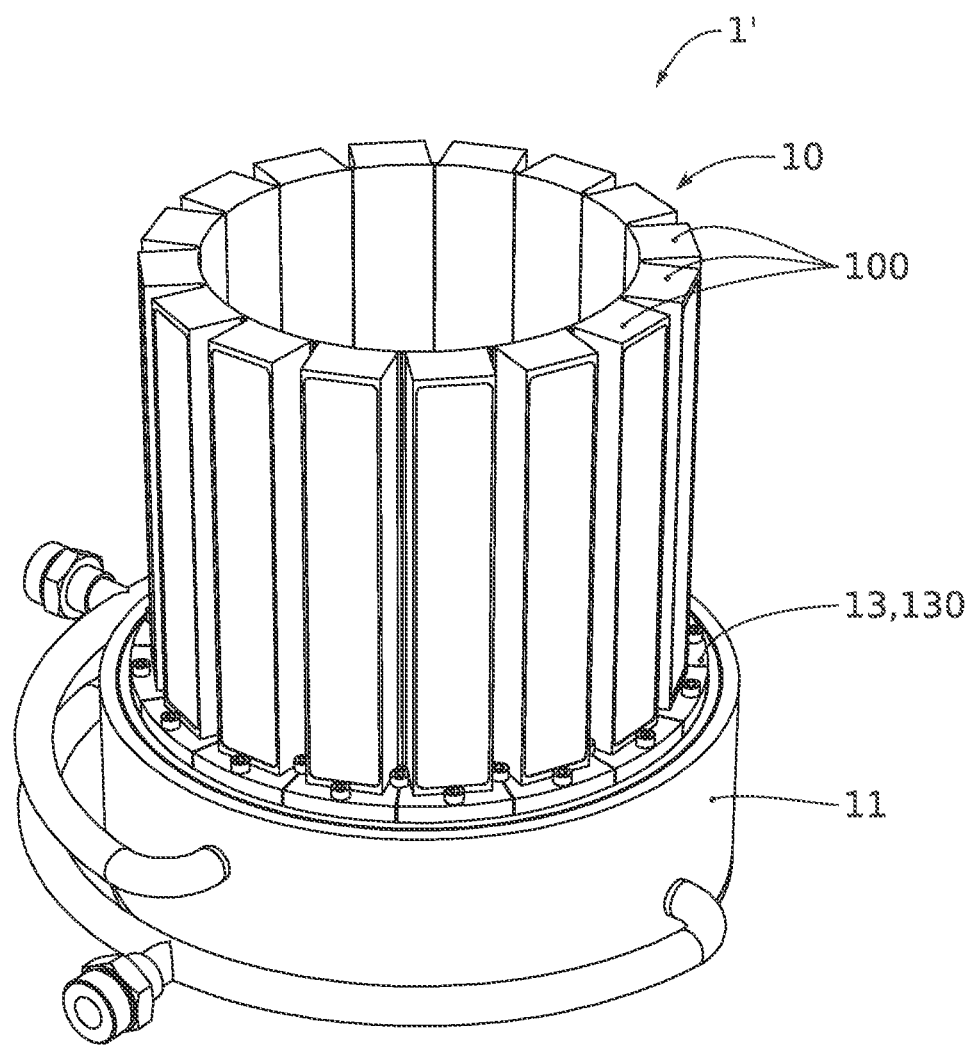
FIG. 3 represents a perspective view of a preferred embodiment of the cold crucible according to the invention equipped with a cooling device.

For this purpose, the invention provides, more particularly, a cold crucible 1', as illustrated for example in FIG. 3, which, in contrast with a conventional cold crucible 1, is essentially such that at least one of its sectors, preferably each of its sectors 100, comprises a housing, called (multi) functionalising housing 101, and is removable.

The (multi)functionalising housing 101 is proper (or suitable) and intended to accommodate at least one (multi) functionalising device 12 of the sector 100 that it comprises. Said at least one (multi)functionalising device 12 may be comprised in the cold crucible 1' according to the invention. Alternatively, a (multi)functionalising device 12 may be supplied as an accessory of a cold crucible according to the invention. Hence, the invention is quite adaptable to different (multi)functionalising devices 12 some examples of them are presented hereinbelow.

More particularly, at least one sector 100 of the cold crucible 1', preferably each sector of the cold crucible, is removable from at least one amongst the cooling device 11 and at least one other sector 100 of the cold crucible 1'. Preferably, each sector 100 of the cold crucible is removable from at least one amongst the cooling device 11 and each other sector 100 of the cold crucible.

Where appropriate, the cold crucible 1' further comprises a device for fastening and holding 13, 130 at least one sector 100, preferably each sector, to at least one amongst the cooling device 11 and to at least one other sector 100. More particularly, the fastening and holding device 13, 130 may be configured so that, once fastened and held, said at least one sector 100 forms at least one portion of the cold cage 10.

Henceforth, it is possible to (multi)functionalise each sector, independently of the others, by accommodating, in the (multi)functionalising housing 101 that it comprises, at least one selected (multi)functionalising device 12. A (multi) functionalising device 12 may be defined, without this definition being necessarily restrictive, as a device allowing modifying or analysing at least one property of the charge, in particular the molten charge, in the cold cage.

In a non-limiting manner, the (multi)functionalising device 12 may be one amongst: a device 120 for generating an electromagnetic field, preferably a permanent magnet, a ferrite, an ultrasonic transducer and a piezoelectric device.

It is also understood that the cold crucible 1' multifunctionalised in this manner has a great modularity. Indeed, numerous combinations between sectors 100 and (multi) functionalising devices 12 could be considered, each potentially conferring one or several particular modification(s) or analysis(es) of the charge 20.

The cold crucible 1' according to the invention allows making the sectors active in the monitoring or characterisation of the charge, in particular the molten charge.

The cooling device 11 comprising a channel for the circulation of a heat-transfer fluid (typically water) configured so as to enable cooling of the cold cage and extending partially in each sector 100, the (multi)functionalising housing 101 may be in communication, and possibly form one integral housing, with the portion of the circulation channel extending in the sector. An advantage of this configuration is that the cooling device 11 may then be used to cool down not only the sector 100, as before, but also the (multi)functionalising device 12. This is particularly advantageous when the (multi)functionalising device 12 comprises a permanent magnet, because the latter could thus be kept at a temperature lower than its Curie temperature. The sector 100 and the (multi)functionalising device 12 that it accommodates being thus constantly cooled by water, the temperature of the (multi)functionalising devices 12 cannot exceed the working temperature of the sector 100, at least to the extent that the (multi)functionalising devices 12 themselves do not emit heat in a significant manner.

Alternatively, the (multi)functionalising housing 101 may be distinct from the portion of the circulation channel extending in the sector 100. This alternative configuration (not represented in the drawings) is to be preferred when a contact between the heat-transfer fluid and the (multi)functionalising device 12 is to be avoided. More particularly, such a contact could make the (multi)functionalising device 12 dysfunctional, or less reliable, accurate, active, etc.

Preferably, the (multi)functionalising device 12 is based on a material that is less good electrical conductor than the material, copper in general, on which the sectors 100 are based. In this manner, it is ensured that the currents induced (eddy currents) by the electromagnetic induction external coil 2 are located at the periphery of the sectors 100 of the cold cage 10. Indeed, copper being one amongst the best known electrical conductors, it then acts as an electromagnetic shield. Thus, each (multi)functionalising device 12 introduced inside a sector 100 is not subjected to the effect of the (electro)magnetic field.

Alternatively or complementarily, the (multi)functionalising device 12 may be arranged together with a support 12b, more particularly an adapter, based on a material that is less good electrical conductor than the material on which the sectors 100 are based. This less good conductor material may even consist of an electrical insulator, such as plastic. Thus, said support 12b enables the sector 100 to fill its electromagnetic shielding role, even when the (multi)functionalising device 12 is based on a material that is as good electrical conductor, and possibly better electrical conductor, as the material on which the sectors 100 are based.

The support 12b may further serve as an adapter. As such, it may further allow adapting any type of (multi)functionalising devices 12, irrespective of its shape and its dimension, to said (multi)functionalising housing 101 which could then have standardised size and shape. The manufacture of the cold crucible 1' according to the invention is facilitated and its cost reduced.

In the case where the (multi)functionalising device 12 comprises, or consists of, a ferrite, it may be configured so as to concentrate the electromagnetic field lines located at the periphery of the sector 100 that accommodates it. Several sectors 100 may accommodate such a (multi)functionalising device 12, it is then possible to concentrate the electromagnetic field lines in some locations of the cold crucible 1', in an independent and modular manner, as each of the sectors 100 is independent.

In the case where the (multi)functionalising device 12 comprises, or consists of, an ultrasonic transducer, it may be configured so as to characterise the molten charge 20 by measuring the speeds of displacement of the matter therewithin.

In the case where the (multi)functionalising device 12 comprises, or consists of, a piezoelectric device, it may be configured so as to introduce pressure waves within the charge 20, in particular the molten charge.

A preferred embodiment of the invention is described hereinbelow with reference to FIGS. 3 to 7. In this preferred embodiment, the (multi)functionalising device 12 comprises, or consists of, an (electro)magnetic field generation device. It should be understood that the characteristics detailed hereinbelow could be adapted mutatis mutandis to the different other (multi)functionalising devices 12 described hereinabove.

The cold crucible 1' illustrated in FIG. 3 comprises a cold cage 10 with a substantially cylindrical shape delimiting an internal space intended to receive a charge to be molten. More particularly, the cold cage 10 consists of a plurality of sectors 100. In a known manner, the sectors 100 are not in electric conduction with one another through at least one portion of their longitudinal edges. On this portion, an air gap may be formed between two adjacent sectors 100. Alternatively, each clearance between two adjacent sectors may be filled with a magnetic insert. More particularly, such an insert may be based on a soft magnetic composite material.

Each sector 100 of the cold crucible 1' illustrated in FIG. 3 is fastened by a base 130, serving as a device for fastening and holding 13 the sectors 100. More particularly, the device 13 allows fastening the sectors 100 on a cooling device 11 and allows holding the sectors 100 in a specific position with respect to one another on the cooling device 11. Fastened and held in this manner, the sectors 100 form the essential part, and possibly the entirety, of the cold cage 10. Alternatively, the sectors may share the same base 130 on which they would be fastened and held, the base being, in turn, fastened to the cooling device 11.

Hence, the cold crucible 1' illustrated in FIG. 3 comprises a cooling device 11 of the type with a heat-transfer fluid, for example water. Such a cooling device 11 may be as known from the prior art. Hence, the cold crucible 1' according to the invention may not require the development or even the adaptation of the known cooling devices 11 which therefore may advantageously be used as such.

Figure 4:
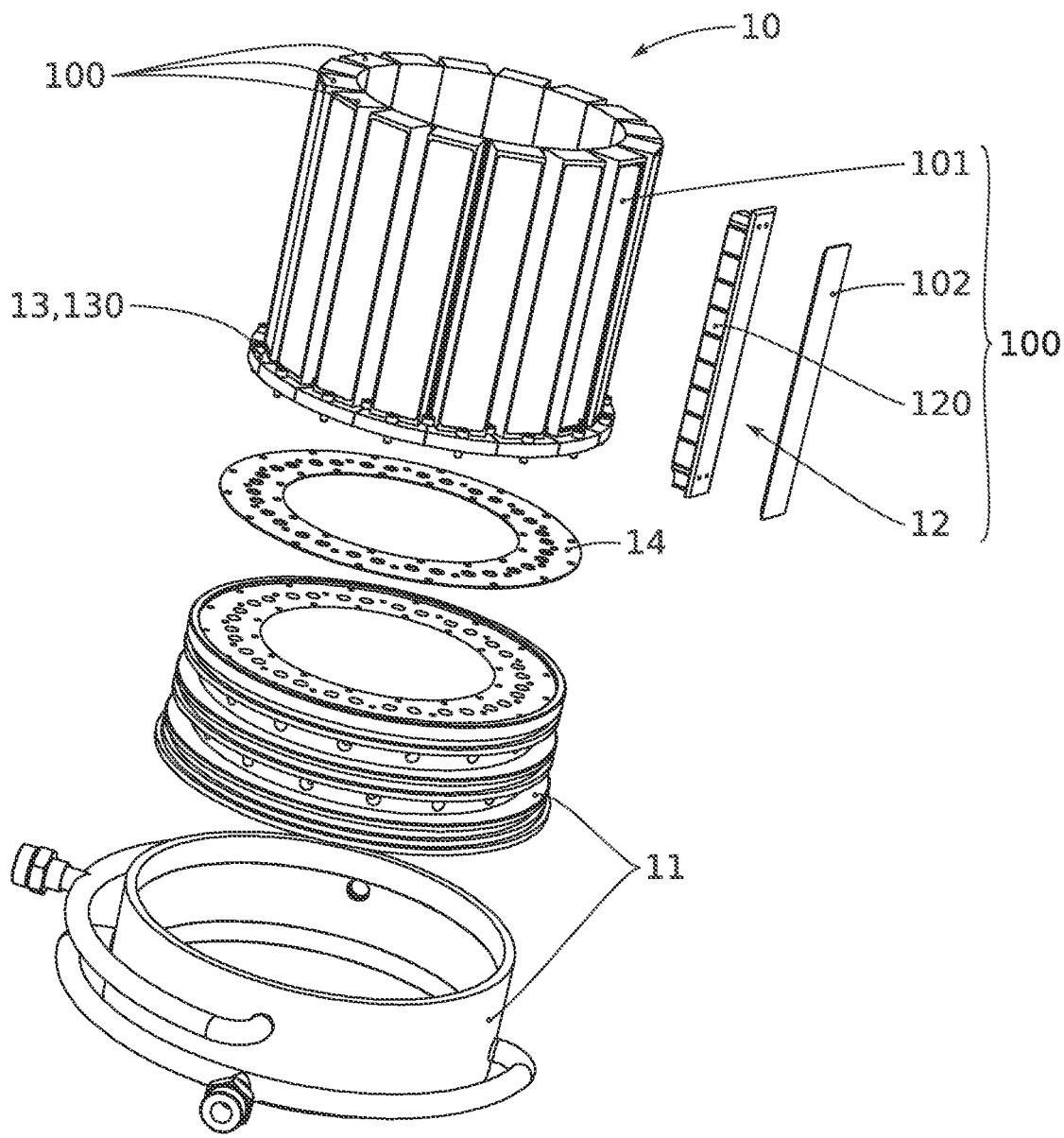
FIG. 4 is a perspective exploded view of the cold crucible and of the cooling device illustrated in FIG. 3, with a static magnetic field generation device as a (multi)functionalising device.

As illustrated in FIG. 4, the cooling device 11 may comprise two portions. A first portion (at the bottom of FIG. 4) by which the heat-transfer fluid is introduced into, and then extracted from, a second portion of the cooling device 11 defining one or several circulation circuit(s) passing partially inside the sectors 100 to cool them down.

A gasket 14, in the form of a cylinder head gasket in the example illustrated in FIG. 4, may be disposed between the second portion of the cooling device 11 and each base 130, so as to ensure sealing between these parts.

Alternatively, the sectors may extend at their base 130 by an inlet and an outlet of the heat-transfer fluid each projecting from the planar surface of the base 130 and each being intended to be inserted into corresponding bores of the cooling device or of an intermediate part (not represented) between the cooling device and the all sectors 100. Sealing between each sector 100 and the cooling device 11 may then be achieved by one or several O-ring gasket(s) distributed along the inlet and outlet projections of the heat-transfer fluid.

In FIG. 4, a partially exploded view of the cold cage 10 is also represented. The sectors 100 are fastened together by their base 130. More particularly, one of the sectors 100 is illustrated in exploded view. Thus, it appears that each sector 100 includes a housing 101 within which the generation device is accommodated.

More particularly, the housing 101 may be closed, preferably by its side opposite to the internal space of the cold cage 10, by a plate 102, made of brass or copper, fixed, preferably by welding, so as to be in electric conduction with the other walls defining the housing 101. Indeed, a conventional cold crucible comprises, as cavity, only one portion of the heat-transfer circulation channel intended to enable cooling thereof; therefore, it is not possible a priori to accommodate any (multi)functionalising device 12, herein a generation device 120, therein without affecting cooling of the sector. Alternatively, each sector 100 could have been designed so as to present a housing 101 proper and intended to receive the generation device 120.

Figure 5:
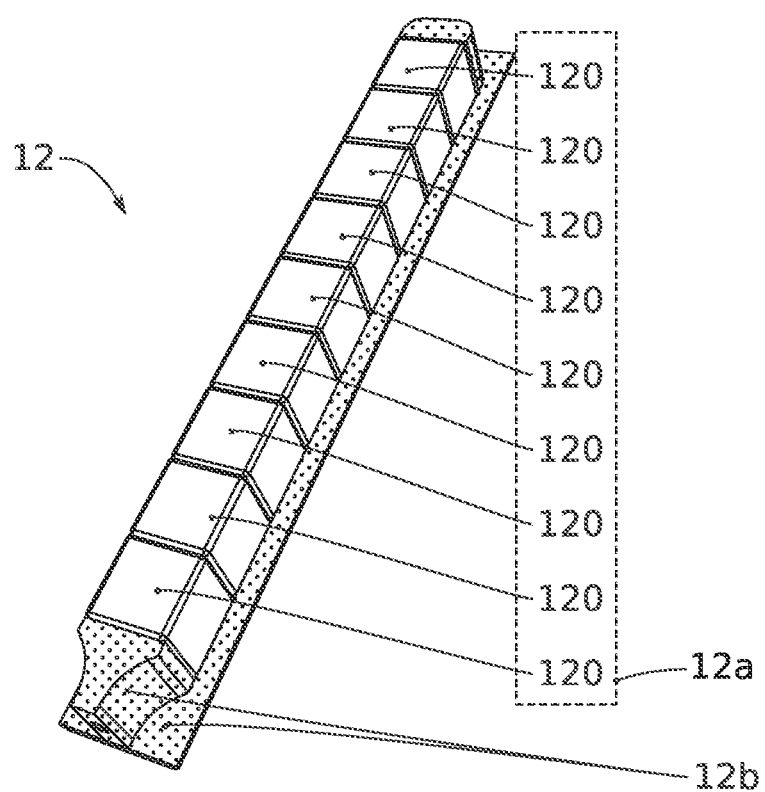
FIG. 5 is a perspective view of a static magnetic field generation device according to the preferred embodiment of the invention.

The generation device 120 as illustrated in FIG. 4 and more particularly represented in FIG. 5. In particular, this figure illustrates the fact that, according to the preferred embodiment of the invention, the generation device 120 essentially comprises two portions 12a and 12b. A first portion 12a is configured so as to generate a static magnetic field. A second portion, called support portion, support or adapter, 12b is configured so as to support the first portion 12a of the generation device. More particularly, the support portion 12b comprises a substantially longitudinal plate from which two holding elements extend perpendicularly. The first portion 12a of the generation device 120 is fastened and held between the two holding elements of the support portion 12b. The two holding elements are further configured so as to provide room for a portion of the heat-transfer fluid circulation circuit in the sector 100, and more particularly in the space of the housing 101 unoccupied by the generation device, around the first portion 12a of the generation device. Thus, a first one amongst the two holding elements (the one at the bottom of FIG. 5) constitutes some kind of central island on either side of which the heat-transfer fluid is intended to circulate in opposite directions; the second one amongst the two holding elements (the one at the top of FIG. 5) constitutes the interior of a meander of the circulation circuit.

Figure 6:
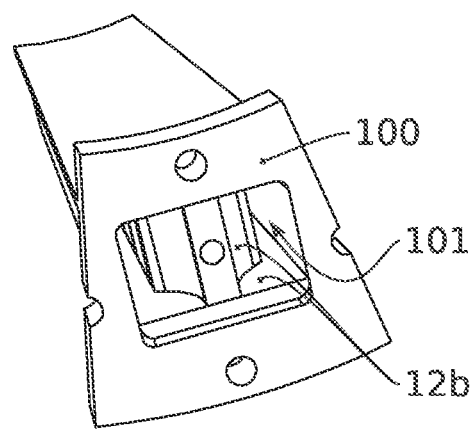
FIG. 6 is a perspective bottom view of a sector according to the preferred embodiment of the invention.

A perspective bottom view of one of the sectors 100 illustrated in FIG. 3 is illustrated in FIG. 6. It is shown that the housing 101 could be opened by its base 130. A series of through bores and/or material recesses may be provided in extensions of the base 130 for fastening to bases of adjacent bases and/or for fastening to the cooling device 11, in particular through the cylinder head gasket 14. More particularly, the material recesses of two adjacent segments 100 may be intended to cooperate together for fastening these segments together. It is also shown in FIG. 6 that the generation device is tightly accommodated within the housing 101. In particular, the second portion 12b comprises a longitudinal plate configured so as to preferably cover the entirety of the internal surface of the housing 101 which is opposite to the internal space of the cold cage 10; and the surface of the first portion 12a of the generation device is bearing on, or at least in contact with, the internal surface of the housing 101 which is directed towards the internal space of the cold cage 10. In this manner, the support 12b serves as an adapter allowing avoiding any movement of the generation device in its housing 101. Hence, the generation device is kept fixed therein. Thus, it also appears that the set formed by sector 100 and by the generation device properly placed in the sector 100 defines the aforementioned circulation circuit portion in the form of a U opening at the base 130 of the sector 100. It should be highlighted that, in this configuration, the first portion 12a of the generation device, configured so as to generate the static magnetic field, is located the closest to the internal space of the cold cage 10. More particularly, only the thickness of the longitudinal wall of the sector 100 which is directed towards the internal space of the cold cage 10 separates the first portion 12a of the generation device and the internal space of the cold cage 10. For example, the thickness of this wall is comprised between 0.5 and 2 mm, preferably comprised between 0.7 and 1.5 mm. Hence, the support 12b serves as an adapter to the extent that it allows achieving, or not, contact between the (multi)functionalising device and the inner walls of the sector that accommodates it. It is understood that the generation device is thus accommodated more particularly in its sector 100 so as to be located, by its edge directed inwardly of the cold cage 10, at a distance substantially smaller than 12 mm, preferably substantially smaller than 9 mm, and still more preferably substantially smaller than 6 mm, from the molten charge 20 in the cold crucible 1'.

Furthermore, it appears that, by its mere construction, the generation device is configured so as to be cooled by the cooling device 11 already in charge of cooling the sector 100 in which the generation device is accommodated.

Figure 7:
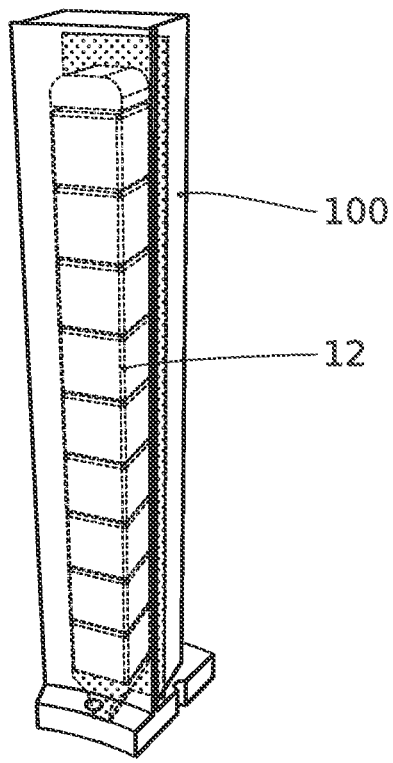
FIG. 7 is a perspective view in transparency of the sector illustrated in FIG. 6.

The first portion 12a of the generation device according to the preferred embodiment of the invention is described hereinbelow with reference to FIGS. 5 and 7.

As illustrated, the first portion 12a of the generation device comprises, in a non-limiting manner, a plurality of nine permanent magnets 120. Henceforth, it is understood that the cooling device 11 is preferably configured and/or parameterised so as to guarantee keeping of each permanent magnet at a temperature strictly lower than the Curie temperature of his magnet; otherwise, the magnetisation of the permanent magnet would be lost.

Figure 8:
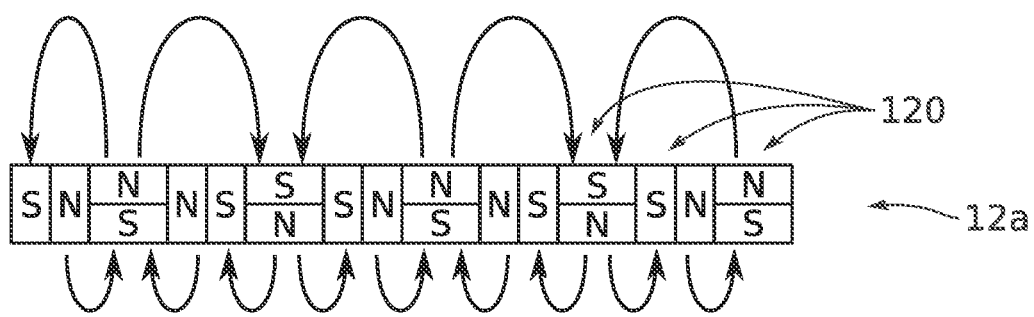
FIG. 8 is a schematic representation of an arrangement of permanent magnets according to a Halbach configuration and of the isomagnetic lines produced by this arrangement.

Each permanent magnet may have substantially cubic geometry, whose edges are for example substantially equal to 2 cm. Of course, the geometry and the dimensions of each permanent magnet should be adapted to the dimensions of the housing 101, and more generally of the sector 100. More particularly, each permanent magnet 120 may be based on a neodymium/iron/boron alloy. Such an alloy has a higher electrical resistivity, and more particularly at least twice higher, than that of the copper constituting the sectors 100 of the cold cage 10. The permanent magnets 120 are aligned with each other and kept aligned by and between the two holding elements of the support portion 12b of the generation device. More particularly, this alignment is such that the permanent magnets 120 are arranged with respect to one another according to a so-called Halbach configuration. Such a configuration is known to allow generating, in one direction perpendicular to the alignment, a more powerful static magnetic field than in another direction perpendicular to the alignment, as illustrated in FIG. 8.

The arrangement of the alignment on the support portion is correlated with the intended disposition of the generation device within the housing 101 of its sector. More particularly, the generation device is disposed within its housing 101 so that the side by which the alignment of the permanent magnets generates a stronger static magnetic field is located directly opposite, and preferably in contact with, the longitudinal wall of the sector 100 which is directed towards the internal space of the cold cage 10.

With permanent magnets as introduced hereinabove as example, the magnetic field generated by the Halbach alignment has a maximum density at 2 mm substantially equal to 0.6 T and also has a maximum density at 12 mm substantially equal to 0.1 T.

Hence, it is understood that, in particular according to this particular arrangement, the generation device is configured so as to generate a static magnetic field with enough density to be felt by the molten charge 20 in the cold cage 10, and more particularly at least across an electromagnetic skin thickness 21 of the molten charge in the cold cage.

More particularly, the static magnetic field generated by the generation device is such that it has a density substantially higher than 0.02 T, preferably substantially higher than 0.05 T, at a distance substantially longer than 2 mm from its edge directed inwardly of the cold cage 10.

Alternatively or complementarily, the static magnetic field generated by the generation device is such that it has a density substantially comprised between 0.07 and 0.8 T at a distance substantially comprised between 0.1 and 12 mm from its edge directed inwardly of the cold cage 10. Preferably, the static magnetic field generated by the generation device is such that it has a density substantially comprised between 0.1 and 0.3 T at a distance substantially comprised between 4 and 10 mm, from one of the edges of the generation device directed inwardly of the cold cage 10.

Figure 9:
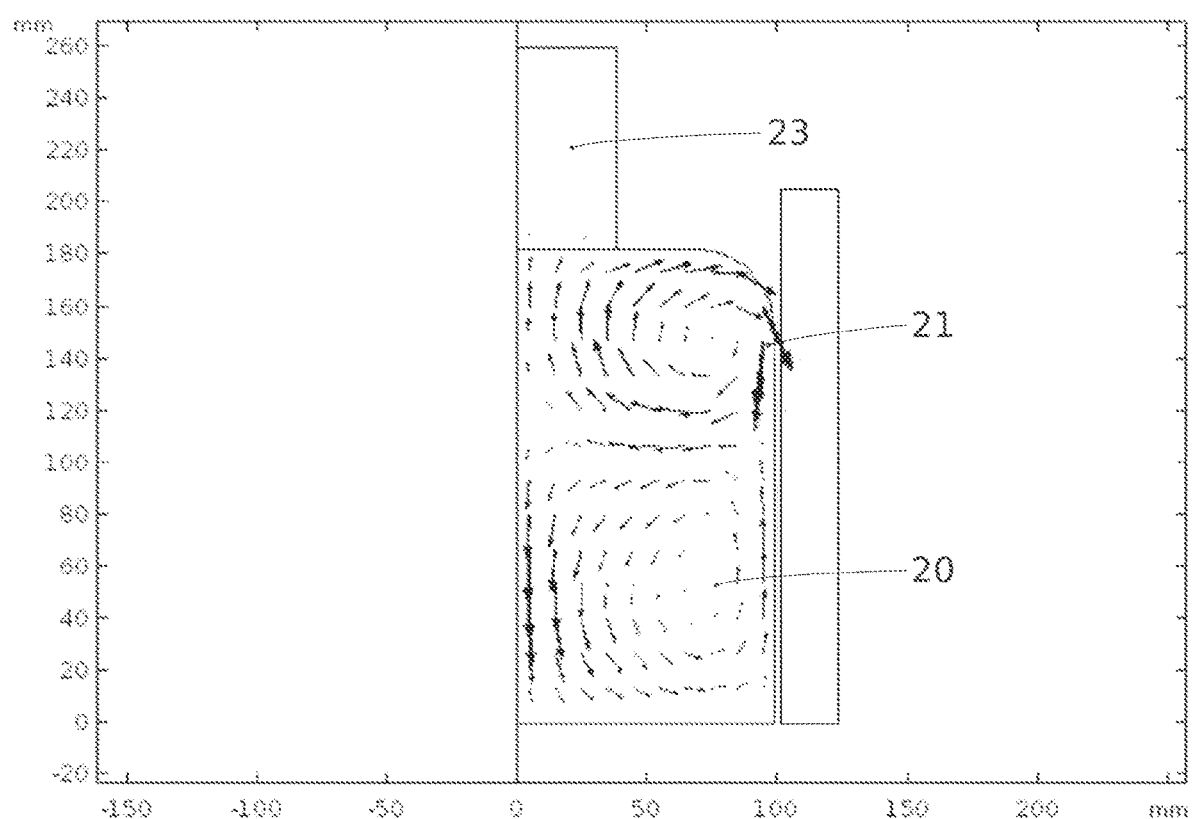
FIGS. 9 and 10 are simulation results of a multiphysics model demonstrating the effectiveness of the cold crucible according to the invention (FIG. 10) (at least one sector of which accommodates a device for generating an electromagnetic field) in comparison with that of a cold crucible according to the prior art (FIG. 9).
Figure 10:
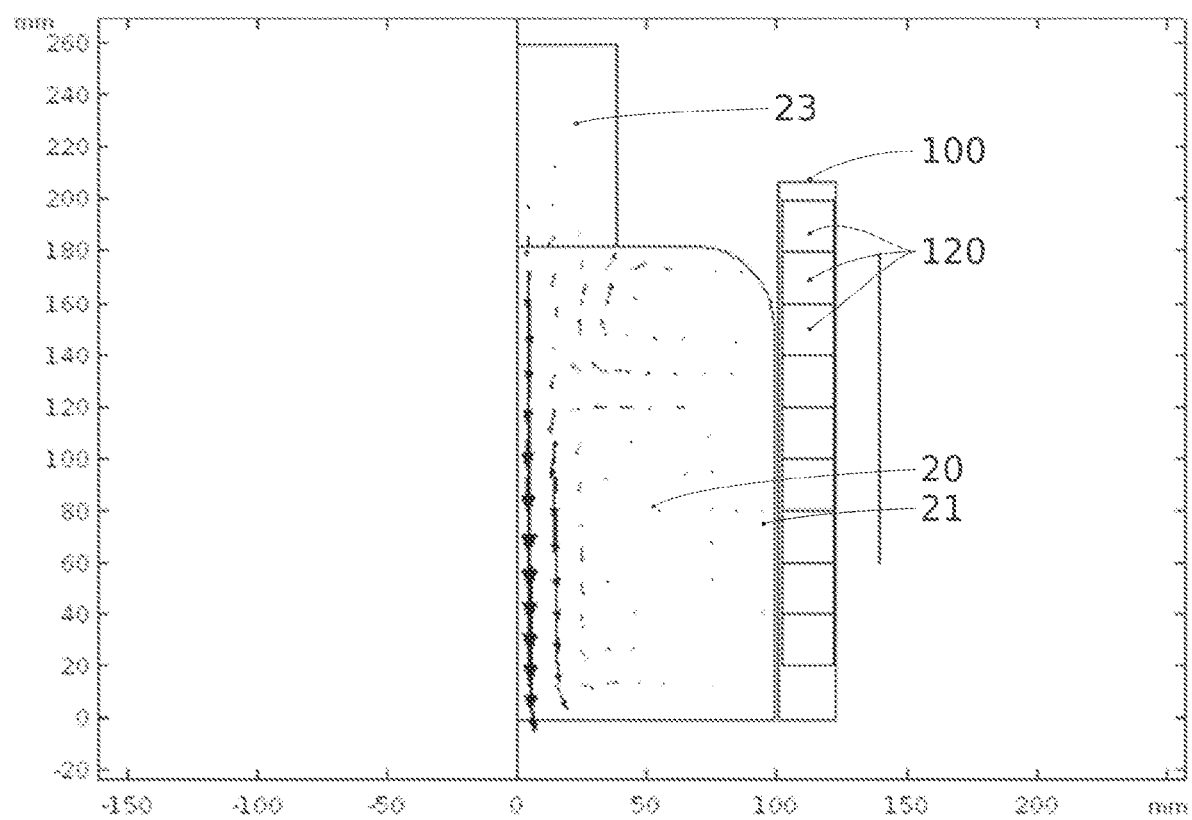

A multiphysics digital model has been developed which allows showing the effectiveness of the cold crucible 1' according to the preferred embodiment of the invention. In FIG. 10, we show that the use of the permanent magnets 120 in the sectors 100 significantly modifies the flow of the molten charge 20 (in the simulation, the material is brought to a temperature substantially equal to 1690° C.) in the cold crucible 1'. This modification translates into a strong slowdown of the stirring vortices in the areas of the molten charge 20 the closest to the cold crucible 1', but also into a reversal of the stirring vortices, these adopting a rotational direction that favours more the growth of a monocrystal from a seed 23 than is the case in a conventional cold crucible (FIG. 9).

Hence, the cold crucible 1' according to the invention allows, on the one hand, slowing down the stirring that would be observed in a conventional cold crucible, on the other hand, reversing the direction of recirculation of the vortices induced in the molten charge 20.

The use of a "magnetic" cold crucible according to the preferred embodiment of the invention allows, in particular by synergy of the aforementioned two technical effects, promoting the growth of monocrystals with a larger size than with a conventional cold crucible. More particularly, the use of a "magnetic" cold crucible according to the preferred embodiment of the invention allows promoting the growth of monocrystals with a larger diameter than the diameter of the seed initiating the growth and of a better quality than that obtained by the techniques implementing hot crucibles.

Another advantage related to the use of "magnetic" cold crucibles according to the preferred embodiment of the invention appears when considering a charge consisting of different materials featuring differences in magnetic susceptibility from each other. For example, such a charge may comprise ferromagnetic, paramagnetic or diamagnetic materials. A "magnetic" cold crucible according to the preferred embodiment of the invention may then allow, by the presence of a static magnetic field gradient extending up the inside of the molten charge 20, for a selective sorting of these materials.

Other advantages may be achieved through the use of a cold crucible 1' according to the preferred embodiment of the invention, in particular by integrating therein sectors whose housings 101 are not occupied by generation devices and/or allow accommodating at least one amongst the other (multi)functionalising devices described before.

Other advantages may also be achieved through the use of a cold crucible 1' according to the preferred embodiment of the invention, in particular by the arrangement of the sectors 100 accommodating generation devices with respect to one another. Indeed, these sectors 100 may be arranged in one of the following ways:
- only two sectors, opposite to one another, accommodate a functionalising device;
- only three sectors, arranged substantially according to a 3-order rotational symmetry, accommodate a functionalising device;
- only four sectors, arranged substantially according to a 4-order rotational symmetry, accommodate a functionalising device;
- one sector out of two adjacent sectors accommodates a functionalising device; and
- each sector accommodates a generation device.

Besides making of oxide monocrystals, such as sapphire, the cold crucible 1' according to the preferred embodiment of the invention allows making monocrystalline silicon ingots with large dimensions, and in particular with a large diameter, in particular for applications in the power electronics field.

The invention is not limited to the previously-described embodiments and extends to all embodiments covered by the claims.

In particular, each generation device is not limited to its embodiment comprising at least one permanent magnet. Indeed, although this is not preferable because of electrical connection difficulties in particular, it could for example be considered that the field is electromagnetic and could be generated by at least one electromagnet. By the fact that the power supply current of such an electromagnet could vary over time thereby varying the magnetic field generated by this electromagnet, it is understood that the electromagnetic field generated by a generation device in a cold crucible 1' according to the preferred embodiment of the invention is not necessarily limited to a static magnetic field; in particular, the electromagnetic field generated by the generation device could be an quasi-static magnetic field.

Moreover, the shape of the sectors is not limited to a substantially parallelepipedic shape as represented in FIGS. 3 to 7, but covers any shape enabling the sectors 100, when fastened and held together, to form the essential part, and possibly the entirety, of the cold cage 10. For example, each sector may be substantially shaped like a petal, and form, together with the other ones, the cold cage, in the same fashion as the formation of corolla by the petals of a flower.

The invention claimed is:

1. A cold crucible comprising:
   a cage called cold cage comprising sectors made of an electrical conductor material, and within which a charge to be melted is to be introduced, and
   a cooling device with a heat-transfer fluid, the cooling device being configured so as to cool down, from inside, each sector of the cold cage,
   wherein at least one of the sectors of the cold cage comprises a functionalising housing and the at least one of the sectors is removable, the functionalising housing being configured to accommodate therein at least one functionalising device of the cold cage, and wherein the at least one functionalising device is based on a material that is less a good electrical conductor than the material on which the sectors are based.

2. The cold crucible according to claim 1, wherein said at least one functionalising device comprises, a device for modifying and/or analysing at least one property of the charge in the cold cage.

3. The cold crucible according to claim 1, further comprising a device for fastening and holding the at least one removable sector, to at least one amongst the cooling device and at least one sector, the fastening and holding device being configured so that, once fastened and held, the at least one removable sector forms a portion of the cold cage.

4. The cold crucible according to claim 1, wherein, the cooling device comprising a circulation channel of the heat-transfer fluid configured so as to enable cooling of the cold cage and extending partially in at least one of the sectors, the functionalising housing is in communication with the portion of the circulation channel extending in the at least one of the sectors, so that said at least one functionalising device is, in turn, cooled by the cooling device.

5. The cold crucible according to claim 1, wherein the at least one functionalising device s arranged together with a support configured so as to adapt a shape and a dimension of said at least one functionalising device at said functionalising housing.

6. The cold crucible according to claim 5, wherein said support is based on a material that is less good electrical conductor than the material, on which the sectors are based.

7. The cold crucible according to claim 5, wherein said support electrically isolates the at least one functionalising device and the sector that accommodates it.

8. The cold crucible according to claim 1, wherein said at least one functionalising device comprises at least one amongst:
   a device for generating an electromagnetic field,
   a ferrite,
   a complementary heating device,
   an ultrasonic transducer, and
   a piezoelectric device.

9. The cold crucible according to claim 8, wherein, with said at least one functionalising device comprising a ferrite, it is configured so as to concentrate electromagnetic field lines located at a periphery of the at least one of the sectors that accommodates it.

10. The cold crucible according to claim 8, wherein, with said at least one functionalising device comprising a piezoelectric device, it is configured so as to introduce pressure waves within the charge.

11. The cold crucible according to claim 8, wherein said at least one functionalising device comprising a device for generating an electromagnetic field, configured so as to generate an electromagnetic field, with a density higher than 0.02 T at a distance larger than 2 mm from an edge of the device for generating an electromagnetic field directed inwardly of the cold cage to be felt by the melted charge in the cold cage.

12. The cold crucible according to claim 11, wherein the generation device comprises at least one permanent magnet.

13. The cold crucible according to claim 1, whose sectors are arranged in one of the following ways:
   only two of the sectors, opposite to one another, accommodate a functionalising device;
   only three of the sectors, arranged substantially according to a 3-order rotational symmetry, accommodate a functionalising device;
   only four of the sectors, arranged substantially according to a 4-order rotational symmetry, accommodate a functionalising device;
   one sector out of two adjacent sectors accommodates a functionalising device; and
   each sector accommodates a functionalising device.

14. A cold crucible comprising:
   a cage called cold cage comprising sectors made of an electrical conductor material and within which a charge to be melted is intended to be introduced, and
   a cooling device with a heat-transfer fluid, the cooling device being configured so as to cool down, from inside, each sector of the cold cage,
   wherein at least one of the sectors of the cold cage comprises a functionalising housing and is removable, the functionalising housing being configured to accommodate therein at least one functionalising device of the cold cage, and
   wherein the at least one functionalising device is arranged together with a support configured so as to adapt a shape and a dimension of said at least one functionalising device at said functionalising housing.

15. A cold crucible comprising:
   a cage called cold cage comprising sectors made of an electrical conductor material and within which a charge to be melted is intended to be introduced, and
   a cooling device with a heat-transfer fluid, the cooling device being configured so as to cool down, from inside, each sector of the cold cage,
   wherein at least one of the sectors of the cold cage comprises a functionalising housing and is removable, the functionalising housing being configured to accommodate therein at least one functionalising device of the cold cage, and
   wherein, with said at least one functionalising device comprising a ferrite, it is configured so as to concentrate electromagnetic field lines located at a periphery of the at least one of the sectors that accommodates it.

16. A cold crucible comprising:
   a cage called cold cage comprising sectors made of an electrical conductor material and within which a charge to be melted is intended to be introduced, and
   a cooling device with a heat-transfer fluid, the cooling device being configured so as to cool down, from inside, each sector of the cold cage,
   wherein at least one of the sectors of the cold cage comprises a functionalising housing and is removable, the functionalising housing being configured to accommodate therein at least one functionalising device of the cold cage, and
   whose sectors are arranged in one of the following ways:
   only two of the sectors, opposite to one another, accommodate a functionalising device;
   only three of the sectors, arranged substantially according to a 3-order rotational symmetry, accommodate a functionalising device;
   only four of the sectors, arranged substantially according to a 4-order rotational symmetry, accommodate a functionalising device;
   one sector out of two adjacent sectors accommodates a functionalising device; and
   each sector accommodates a functionalising device.

\* \* \* \* \*